United States Patent
Hämäläinen et al.

(10) Patent No.: US 11,643,728 B2
(45) Date of Patent: May 9, 2023

(54) ATOMIC LAYER DEPOSITION AND ETCHING OF TRANSITION METAL DICHALCOGENIDE THIN FILMS

(71) Applicant: ASM IP HOLDING B.V., Almere (NL)

(72) Inventors: Jani Hämäläinen, Espoo (FI); Mikko Ritala, Espoo (FI); Markku Leskelä, Espoo (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/303,806

(22) Filed: Jun. 8, 2021

(65) Prior Publication Data

US 2021/0388503 A1    Dec. 16, 2021

Related U.S. Application Data

(60) Provisional application No. 63/037,877, filed on Jun. 11, 2020.

(51) Int. Cl.
  *C23F 1/12*  (2006.01)
  *C23C 16/56*  (2006.01)
  (Continued)

(52) U.S. Cl.
  CPC ............ *C23C 16/56* (2013.01); *C23C 16/305* (2013.01); *C23C 16/45534* (2013.01);
  (Continued)

(58) Field of Classification Search
  CPC ............................ C23F 1/12; H01L 21/02568
  See application file for complete search history.

(56) References Cited

U.S. PATENT DOCUMENTS 4,368,115 A * 1/1983 Chianelli ............... C01G 1/12
                                                          502/215
5,169,685 A    12/1992 Woodruff et al.
(Continued)

FOREIGN PATENT DOCUMENTS

JP    H04340254    11/1992
JP    2004346401    12/2004
(Continued)

OTHER PUBLICATIONS

Hamalainen, Ritala, Leskela, "Controlled Etching of ALO Grown ReS2 by 02 Pulses", invention disclosure, submitted to HIS 19.12.2018.
(Continued)

*Primary Examiner* — Thomas T Pham
(74) *Attorney, Agent, or Firm* — Knobbe, Martens, Olson & Bear LLP

(57) ABSTRACT

Vapor deposition methods for depositing transition metal dichalcogenide (TMDC) films, such as rhenium sulfide thin films, are provided. In some embodiments TMDC thin films are deposited using a deposition cycle in which a substrate in a reaction space is alternately and sequentially contacted with a vapor phase transition metal precursor, such as a transition metal halide, a reactant comprising a reducing agent, such as $NH_3$ and a chalcogenide precursor. In some embodiments rhenium sulfide thin films are deposited using a vapor phase rhenium halide precursor, a reducing agent and a sulfur precursor. The deposited TMDC films can be etched by chemical vapor etching using an oxidant such as $O_2$ as the etching reactant and an inert gas such as $N_2$ to remove excess etching reactant. The TMDC thin films may find use, for example, as 2D materials.

7 Claims, 1 Drawing Sheet

(51) Int. Cl.
  *H01L 21/02* (2006.01)
  *C23C 16/30* (2006.01)
  *C23C 16/455* (2006.01)
  *H01L 21/465* (2006.01)

(52) U.S. Cl.
  CPC ............ *C23F 1/12* (2013.01); *H01L 21/0262* (2013.01); *H01L 21/02568* (2013.01); *H01L 21/465* (2013.01)

(56) References Cited

U.S. PATENT DOCUMENTS

| | | | |
|---|---|---|---|
| 5,577,263 | A | 11/1996 | West |
| 6,238,734 | B1 | 5/2001 | Senzaki et al. |
| 6,537,613 | B1 | 3/2003 | Senzaki et al. |
| 9,644,263 | B2 | 5/2017 | Kim et al. |
| 10,400,331 | B2 | 9/2019 | Choi et al. |
| 10,619,242 | B2 | 4/2020 | Hamalainen et al. |
| 2002/0182320 | A1 | 12/2002 | Leskela et al. |
| 2005/0101130 | A1 | 5/2005 | Lopatin et al. |
| 2006/0029748 | A1 | 2/2006 | Ishizaka et al. |
| 2008/0102205 | A1 | 5/2008 | Barry et al. |
| 2008/0274617 | A1 | 11/2008 | Milligan |
| 2009/0163383 | A1 | 6/2009 | Sun et al. |
| 2010/0075037 | A1 | 3/2010 | Marsh et al. |
| 2015/0118487 | A1 | 4/2015 | Wolden et al. |
| 2016/0122868 | A1 | 5/2016 | Kim et al. |
| 2018/0155832 | A1* | 6/2018 | Hamalainen ............ C23C 16/06 |

FOREIGN PATENT DOCUMENTS

| | | |
|---|---|---|
| JP | 2007046105 | 2/2007 |
| KR | 101535573 | 7/2015 |
| KR | 20150098904 | 8/2015 |
| WO | WO 2016/191432 | 12/2016 |

OTHER PUBLICATIONS

Hämäläinen et al., "Atomic Layer Deposition of Rhenium Disulfide", Adv. Mater. 2018, 30, 1703622, in 6 pages.

Hämäläinen et al. "Rhenium Metal and Rhenium Nitride Thin Films Grown by Atomic Layer Deposition", Angew. Chem. Int. Ed. 2018, 57, pp. 14538-14542.

Shim et al., "High-Performance 2D Rhemium Disulfide ($ReS_2$) Transistors and Photodetectors by Oxygen Plasma Treatment", Adv. Mater. 28 (2016), pp. 6985-6992.

Bosi, Matteo, "Growth and synthesis of mono and few-layers transition metal dichalcogenides by vapour techniques: a review", RSC Adv., 5, 2015, pp. 75500-75518.

Feng et al., "Raman vibrational spectra of bulk to monolayer ReS2 with lower symmetry", Phys. Rev. B. 92, Issue 5, 2015, pp. 054110-1-054110-6.

Fujita et al., "Chemically Exfoliated ReS2 Nanosheets", Nanoscale, 6, 2014, pp. 12458-12462.

He et al., "Chemical Vapor Deposition of High-Quality and Atomically Layered ReS2", Small Journal, 2015, 11, No. 40, pp. 5423-5429.

Johnson, Dexter, "Rhenium Disulfide: A New 3-D Material That Has the Electronic Properties of a 2-D Material", IEEE Spectrum, Mar. 21, 2014, in 3 pages.

Keyshar et al., "Chemical Vapor Deposition of Monolayer Rhenium Disulfide (ReS2)", Advanced Materials, 2015, vol. 27, pp. 4640-4648.

Liu et al., "Integrated digital inverters based on two-dimensional anisotropc ReS2 field-effect transistors", Nature Communications 6, Article No. 6991, May 7, 2015, pp. 1-7.

Sanjaya, Aamir, "Unique Properties of Rhenium Disulfide", Nanotech etc., Apr. 4, 2014, in 2 pages.

She et al., "Highly Dispersed and Active ReOx on Alumina-Modified SBA-15 Silica for 2-Butanol Dehydration", ACS Catal., 2012, 2 (6), pp. 1020-1026.

Tongay et al., "Monolayer behavior in bulk ReS2 due to electronic and vibrational decoupling", Nature Communications 5, Feb. 6, 2014, pp. 1-6.

Xu et al., "Sulfur vacancy activated field effect transistors based on ReS2 nanosheets", Nanoscale, 2015 vol. 7, pp. 15757-15762.

Yarris, Lynn, "Discovery of New Semiconductor Holds Promise for 2D Physics and Electronics", News Center, DOE Office of Science, Mar. 20, 2014, in 4 pages.

Yu et al., "Robust Direct Bandgap Characteristics of One- and Two-Dimensional ReS2", Scientific Reports 5, Article No. 13783, (2015), pp. 1-9.

Zhang et al., "ReS2-Based Field-Effect Transistors and Photodetectors", Advanced Functional Materials, vol. 25, Issue 26, 2015, pp. 4076-4082.

\* cited by examiner

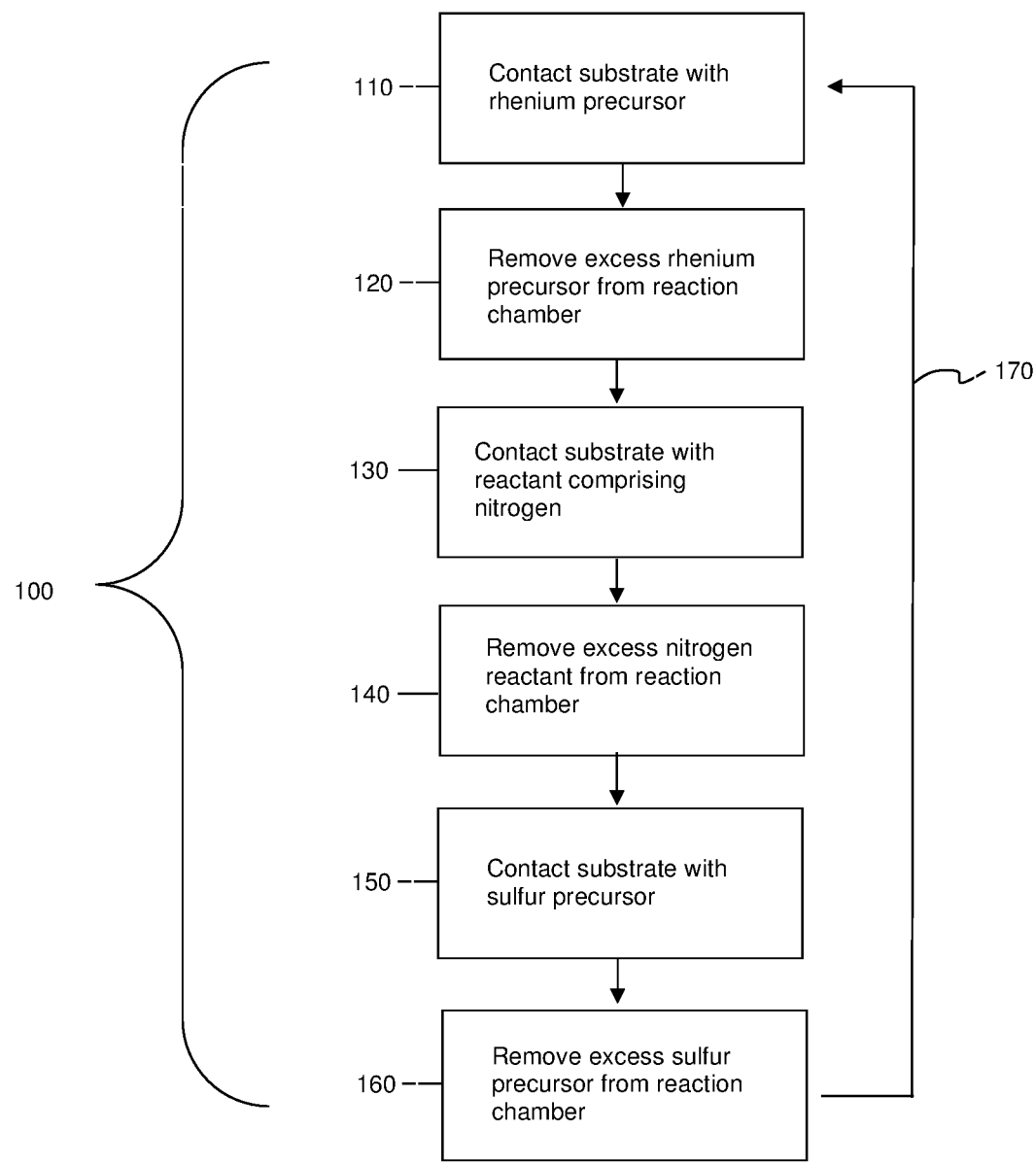

ATOMIC LAYER DEPOSITION AND ETCHING OF TRANSITION METAL DICHALCOGENIDE THIN FILMS

REFERENCE TO RELATED APPLICATIONS

The present application claims priority to U.S. Application No. 63/037,877, filed Jun. 11, 2020, which is incorporated herein by reference in its entirety.

BACKGROUND

Field of the Invention

The present application relates generally to atomic layer deposition methods for forming transition metal dichalcogenide films such as rhenium sulfide films and chemical vapor etching methods for etching such films.

Background

Transition metal dichalcogenide (TMDC) films such as rhenium sulfide thin films find use in a wide variety of different applications. For example, rhenium disulfide has been shown to behave similarly to 2D materials, even in 3D bulk form. Thus, such films may find applications in low-friction applications, targeting photonics, photocatalysis, water-splitting, lithium-ion or lithium sulfur batteries, solar cell applications and quantum computing and ultrafast data processing.

SUMMARY

Transition metal dichalcogenide (TMDC) films can be deposited by vapor deposition processes, such as atomic layer deposition (ALD) or pulsed chemical vapor deposition (CVD) process. The transition metal dichalcogenide films can be deposited by methods comprising a plurality of deposition cycles in which the substrate is alternately contacted with a first reactant comprising a transition metal precursor, such as a transition metal halide, a second reactant comprising a reducing agent, such as $NH_3$ or a silane or borane compound, and a third reactant comprising a chalcogenide precursor. In some embodiments the chalcogenide precursor comprises sulfur, selenium or tellurium. In some embodiments the TMDC has the formula $MX_2$, where M is a transition metal and X is S, Te or Se. In some embodiments M is Mo, W, Re, Nb, Ni or V. In some embodiments M is Mo, W or Re. In some embodiments a transition metal sulfide is deposited. In some embodiments the TMDC film comprises $ReS_2$, $TaS_2$, $ZrS_2$, $HfS_2$ or $SnS_2$. In some embodiments a TMDC film comprises $ReTe_2$, $TaTe_2$, $ZrTe_2$, $HfTe_2$ or $SnTe_2$. In some embodiments a TMDC film comprises $ReSe_2$, $TaSe_2$, $ZrSe_2$, $HfSe_2$ or $SnSe_2$.

In some embodiments the methods are atomic layer deposition methods in which a substrate is alternately and sequentially contacted with the first reactant comprising a vapor-phase transition metal precursor, the second reactant and the third reactant comprising a chalcogenide precursor. The excess precursor or reactant may be removed from the reaction space, along with any reaction byproducts, between the contacting steps. In some embodiments two or more sequential deposition cycles are carried out until a TMDC thin film of a desired thickness has been deposited on the substrate.

In some embodiments, the TMDC deposition cycles are carried out at a deposition temperature of about 200 to about 500° C. In some embodiments, the deposition cycles are carried out at a deposition temperature of about 400° C.

In some embodiments the TMDC thin film is a two-dimensional material.

In some embodiments the TMDC films find use, for example, as 2D materials, as channel materials in a logic device, as a work function metal in a gate stack, as metal capping layers, for example copper, cobalt or tungsten capping layers or as contact metal layers or as fill layers for 3D-structures, such as vias, trenches or other structures. In some embodiments TMDC thin films are used in applications such as low-friction layers in MEMS, targeting photonics, photocatalysis, water-splitting, or in lithium-ion or lithium sulfur batteries.

In some embodiments Rhenium sulfide ($ReS_2$) films can be deposited by vapor-deposition processes, such as atomic layer deposition (ALD) or sequential or pulsed chemical vapor deposition (CVD) processes. In some embodiments thin films comprising $ReS_2$ are deposited. The rhenium sulfide thin films may be deposited by cyclic vapor deposition processes, for example using rhenium halide precursors. The rhenium sulfide thin films may find use, for example, as 2D materials, as channel materials in a logic device, as a work function metal in a gate stack, as metal capping layers, for example copper, cobalt or tungsten capping layers or as contact metal layers or as fill layers for 3D-structures, such as vias, trenches or other structures. In some embodiments rhenium sulfide thin films are used in applications such as targeting photonics, photocatalysis, water-splitting, or in lithium-ion or lithium sulfur batteries.

In accordance with one aspect, methods for depositing rhenium sulfide thin films on a substrate are provided. The methods may comprise one or more deposition cycles each comprising contacting the substrate in a reaction space with a first reactant comprising a vapor-phase rhenium precursor, such as a rhenium halide, a second vapor-phase reactant comprising a reducing agent, and a third vapor-phase reactant comprising a sulfur precursor, such as $H_2S$. In some embodiments the reducing agent comprises a nitrogen-containing compound, such as $NH_3$. In some embodiments the reducing agent is a silane or borane compound. In some embodiments two or more deposition cycles are carried out sequentially. In some embodiments the methods may be atomic layer deposition or pulsed or sequential chemical vapor deposition methods.

In some embodiments when contacting the substrate with the vapor-phase rhenium precursor the substrate is not contacted with any other metal, semi-metal or metalloid precursor.

In some embodiments the substrate is contacted with a rhenium precursor comprising a single rhenium compound and the substrate is not simultaneously contacted with any other compound comprising a metal, semi-metal or metallic element.

In some embodiments the substrate is contacted with a rhenium precursor that is not a mixture, and the substrate is not simultaneously contacted with any other reactant comprising a metal, semi-metal or metallic element.

In some embodiments the rhenium precursor is a rhenium halide, such as $ReCl_5$ or $ReF_6$. In some embodiments the second reactant comprises a reducing agent. In some embodiments the reducing agent comprises nitrogen, and may comprise, for example, $NH_3$, $N_2$, $N_2H_4$, nitrogen plasma, excited species of nitrogen, nitrogen radicals, atomic nitrogen or hydrazine species. In some embodiments the second reactant may comprise hydrogen species, such as hydrogen plasma, excited species of hydrogen, hydrogen radicals or atomic hydrogen. In some embodiments the third reactant comprises sulfur, for example $H_2S$. In some embodiments the sulfur precursor is an alkylsulfur compound. In some embodiments the third reactant comprises one or more of elemental sulfur, $H_2S$, $(CH_3)_2S$, $(NH_4)_2S$, $((CH_3)_2SO)$, and $H_2S_2$. In some embodiments the rhenium precursor comprises $ReCl_5$, the second reactant comprises $NH_3$ and the sulfur precursor comprises $H_2S$. In some embodiments the rhenium precursor is $ReCl_5$, the second reactant is $NH_3$ and the sulfur precursor is $H_2S$.

In some embodiments, the deposition cycles are carried out at a deposition temperature of about 200 to about 500° C. In some embodiments, the deposition cycles are carried out at a deposition temperature of about 400° C.

In some embodiments the methods are atomic layer deposition methods in which the substrate is alternately and sequentially contacted with the first vapor-phase rhenium precursor, the second reactant and the third reactant. The excess precursor or reactant may be removed from the reaction space, along with any reaction byproducts, between the contacting steps. In some embodiments two or more sequential deposition cycles are carried out until a rhenium sulfide thin film of a desired thickness has been deposited on the substrate.

In some embodiments the rhenium sulfide thin film is a two-dimensional material.

In some embodiment, the rhenium sulfide thin film has a thickness of less than about 10 nm, or even less than about 5 nm.

In some embodiments the deposition cycle is repeated sequentially to form 20 molecular layers of $ReS_2$ or less, or 10 molecular layers of $ReS_2$ or less. In some embodiments less than about 3 molecular layers of $ReS_2$ are deposited.

In some embodiments, a cyclic vapor deposition method for depositing a thin film comprising $ReS_2$ on a substrate in a reaction chamber comprises a plurality of deposition cycles. Each cycle may comprise alternately and sequentially contacting the substrate in the reaction space with a first vapor-phase reactant comprising a rhenium halide, a second vapor phase reactant comprising a reducing agent, such as $NH_3$, and a third vapor phase reactant comprising sulfur. In some embodiments the first vapor phase reactant comprises $ReCl_5$, the second vapor phase reactant comprises $NH_3$ and the third vapor phase reactant comprises $H_2S$. Excess vapor phase reactants can be removed from the reaction chamber after contacting the substrate with one vapor phase reactant and prior to contacting the substrate with the next vapor phase reactant.

In another aspect, methods of chemical vapor etching of TMDC thin films are provided. In some embodiments the methods comprise a plurality of etch cycles, where each etch cycle comprises contacting a TMDC thin film on a substrate with a first etching reactant comprising oxygen and purging excess first etching reactant from the reaction space with an inert gas. In some embodiments a thin film comprising TMDC is etched by a plurality of etch cycles comprising contacting the thin film with an etch reactant comprising $O_2$ and removing the $O_2$ with a purge gas comprising $N_2$. In some embodiments a TMDC film on a substrate in a reaction chamber is etched by a plurality of etch cycles in which the TMDC film is contacted with $O_2$ and then $O_2$ is removed from the reaction chamber by purging with $N_2$ gas.

In some embodiments TMDC thin film that is etched has been deposited by a deposition process as described herein. For example, the TMDC thin film may have been deposited by an atomic layer deposition process using a rhenium halide precursor, $NH_3$ and $H_2S$.

In some embodiments one or more etch cycles is included in a vapor deposition process for depositing a TMDC film as described herein. In some embodiments one or more etch cycles is included at regular intervals in the deposition process. In some embodiments one or more etch cycles is provided at a given ratio to the number of deposition cycles. For example, an etch cycle may be carried out every 1, 2, 3, 4, 5, 10, 20, 50 or more deposition cycles. In some embodiments two or more deposition cycles are carried out for each etch cycle. In some embodiments the ratio of deposition cycles to etch cycles is at least 10. In some embodiments one or more etch cycles is carried out following deposition of a TMDC film. In some embodiments one or more etch cycles is carried out immediately following deposition of a TMDC film.

In some embodiments one or more etch cycles are carried out at a temperature of about 200° C. to about 500° C.

In some embodiments rhenium sulfide thin films are etched by the provided vapor etch processes. In some embodiments the methods comprise a plurality of etch cycles, where each etch cycle comprises contacting a rhenium sulfide thin film on a substrate with a first etching reactant comprising oxygen and purging excess first etching reactant from the reaction space with an inert gas. In some embodiments a thin film comprising $ReS_2$ is etched by a plurality of etch cycles comprising contacting the thin film with an etch reactant comprising $O_2$ and removing the $O_2$ with a purge gas comprising $N_2$. In some embodiments a $ReS_2$ film on a substrate in a reaction chamber is etched by a plurality of etch cycles in which the $ReS_2$ film is contacted with $O_2$ and then $O_2$ is removed from the reaction chamber by purging with $N_2$ gas.

In some embodiments the rhenium sulfide thin film that is etched has been deposited by a deposition process as described herein. For example, the rhenium sulfide thin film may have been deposited by an atomic layer deposition process using a rhenium halide precursor, $NH_3$ and $H_2S$.

In some embodiments one or more etch cycles is included in a vapor deposition process for depositing a $ReS_2$ film as described herein. In some embodiments one or more etch cycles is included at regular intervals in the deposition process. In some embodiments one or more etch cycles is provided at a given ratio to the number of $ReS_2$ deposition cycles. For example, an etch cycle may be carried out every 1, 2, 3, 4, 5, 10, 20, 50 or more deposition cycles. In some embodiments two or more deposition cycles are carried out for each etch cycle. In some embodiments the ratio of deposition cycles to etch cycles is at least 10. In some embodiments one or more etch cycles is carried out following deposition of a TMDC film. In some embodiments one or more etch cycles is carried out immediately following deposition of a TMDC film.

In some embodiments the etch cycles are carried out at a temperature of about 200° C. to about 500° C.

BRIEF DESCRIPTION OF THE DRAWINGS

FIG. 1 is a process flow diagram generally illustrating processes for depositing rhenium disulfide films by ALD.

DETAILED DESCRIPTION

Transition metal dichalcogenide (TMDC) thin films, such as rhenium sulfide thin films, can be deposited on a substrate by vapor phase deposition processes, such as atomic layer deposition-(ALD) and chemical vapor deposition (CVD)-type processes. In some embodiments a vapor deposition process can deposit a rhenium sulfide material, such as rhenium disulfide ($ReS_2$). Although described herein primarily in the context of deposition of rhenium disulfide thin films, other transition metal dichalcogenide films can be deposited by analogous processes. For example, in some embodiments molybdenum dichalcogenide films or tungsten dichalcogenide films are deposited by the disclosed methods. In some embodiments a transition metal sulfide is deposited. For example, in some embodiments a film comprising $ReS_2$, $TaS_2$, $ZrS_2$, $HfS_2$ or $SnS_2$ is deposited. In some embodiments a transition metal telluride is deposited. For example, in some embodiments a film comprising $ReTe_2$, $TaTe_2$, $ZrTe_2$, $HfTe_2$ or $SnTe_2$ is deposited. In some embodiments a transition metal selenide is deposited. For example, in some embodiments a film comprising $ReSe_2$, $TaSe_2$, $ZrSe_2$, $HfSe_2$ or $SnSe_2$ is deposited.

Chemical vapor etching cycles can also be used to etch TMDC films. For example, the growth of the TMDC film can be regulated and/or their properties adjusted by one or more etch cycles. In some embodiments one or more etch cycles is included at one or more intervals in a TMDC deposition process. In some embodiments one or more etch cycles is carried out following deposition of a TMDC film.

In some embodiments a TMDC deposition process uses a first reactant comprising a vapor phase transition metal precursor as described herein in combination with a second vapor phase reactant comprising a reducing agent as described herein and a third vapor phase chalcogenide precursor as described herein. In some embodiments the chalcogenide precursor comprises sulfur, selenium or tellurium. In some embodiments the TMDC has the formula $MX_2$, where M is a transition metal and X is S, Te or Se. In some embodiments M is Mo, W, Re, Nb, Ni or V. In some embodiments M is W, Mo or Re.

In some embodiments a rhenium disulfide thin film is deposited by a deposition process using a first reactant comprising a vapor phase rhenium precursor as described herein in combination with a second vapor phase reactant comprising a reducing agent as described herein and a third vapor phase sulfur precursor as described herein.

In some embodiments vapor deposition processes comprise contacting the substrate with a vapor phase transition metal precursor, such as a rhenium precursor, for example a transition metal halide such as a rhenium halide, and at least two additional vapor phase reactants. In some embodiments the two additional reactants comprise a reducing agent and a chalcogenide precursor. For example, in some embodiments rhenium sulfuide thin films may be deposited by an ALD process comprising alternately and sequentially contacting a substrate with a first reactant comprising a vapor phase rhenium precursor, such as a rhenium halide, a second vapor phase reactant comprising a reducing agent, such as a reducing agent comprising nitrogen, for example $NH_3$, and a third reactant comprising a sulfur precursor, such as $H_2S$. In some embodiments rhenium sulfide films may be deposited, for example, by an ALD process comprising alternately and sequentially contacting a substrate with a vapor phase rhenium halide, such as $ReCl_5$, a second reactant comprising $NH_3$ and a third vapor phase sulfur-containing reactant, such as $H_2S$.

Suitable substrate materials on which the TMDC thin films, such as rhenium sulfide films, may be deposited may include insulating materials, dielectric materials, conductive materials, metallic materials, amorphous materials, crystalline materials, epitaxial, heteroepitaxial, and/or single crystal materials such as oxides. For example, the substrate may comprise $Al_2O_3$, sapphire, silicon, silicon oxide, or an insulating nitride, such as AlN. In some embodiments the substrate on which the TMDC film is deposited comprises a semiconductor material. In some embodiments a TMDC film is deposited directly on a semiconductor material. In some embodiments a TMDC film is deposited on a material overlying a semiconductor material. Further, the substrate material and/or substrate surface may be selected by the skilled artisan to enhance, increase, or maximize two-dimensional crystal growth thereon. In some embodiments the substrate surface on which the TMDC film, such as a rhenium sulfide thin film, or material is to be deposited does not comprise a semiconductor material, such as Si, Ge, III-V compounds, for example GaAs and InGaAs, or II-VI compounds. In some embodiments the substrate surface on which the TMDC thin film, such as a rhenium sulfide thin film or material, is to be deposited may comprise materials other than insulating materials or may consist only of materials other than insulating materials.

In some embodiments of the disclosed vapor deposition processes for depositing the TMDC films, such as the exemplified rhenium sulfide films, three or more reactants are sequentially provided, for example in an ALD- or CVD-type process. ALD-type processes are based on controlled, typically self-limiting surface reactions of the precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge. In some embodiments the substrate is contacted with a purge gas, such as an inactive gas. For example, the substrate may be contacted with a purge gas between reactant pulses to remove excess reactant and reaction by-products.

CVD type processes typically involve gas phase reactions between two or more reactants. The reactants can be provided simultaneously to the reaction space or substrate, or in partially or completely separated pulses. The substrate and/or reaction space can be heated to promote the reaction between the gaseous reactants. In some embodiments the reactants are provided until a thin film having a desired thickness is deposited. In some embodiments cyclical CVD type processes can be used with multiple cycles to deposit a thin film having a desired thickness. In cyclical CVD-type processes, the reactants may be provided to the reaction chamber in pulses that do not overlap, or that partially or completely overlap.

In some embodiments a deposition process for a rhenium sulfide thin film or other TMDC thin film has one or more steps which are not self-limiting. For example, in some embodiments at least one of the reactants is at least partially decomposed on the substrate surface. Thus, in some embodiments the process may operate in a process condition regime close to CVD conditions or in some cases fully in CVD conditions. In some embodiments a sequential or pulsed CVD process is utilized. In some embodiments a material comprising rhenium sulfide (or other TMDC) is deposited by a pulsed CVD process in which multiple pulses of a first reactant comprising a rhenium precursor (or other transition metal precursor), such as a rhenium halide, a second reactant comprising a reducing agent, such as $NH_3$ and a third reactant comprising a sulfur precursor, such as $H_2S$, are separated by purge or removal steps in which reactant is removed from the substrate surface. For example, the substrate may be exposed to a purge gas between reactant pulses. In some embodiments the substrate is contacted with a purge gas between a pulse of a reactant and the pulse of the subsequent reactant. In some embodiments the substrate is contacted with a purge gas following each reactant pulse.

In some embodiments an ALD-process can be modified to be at least a partial CVD process. In some embodiments a partial CVD process can include at least partial decomposition of one or more precursors and/or at least partial overlap of two or more reactants. In some embodiments ALD processes can be modified to be a sequential or pulsed CVD process. A sequential or pulsed CVD process may utilize the same precursors and reaction conditions such as temperature and pressure as a corresponding ALD process.

In some embodiments an ALD process is modified to use overlapping or partially overlapping pulses of reactants. In some embodiments an ALD process is modified to use extremely short purge or removal times, such as below 0.1 s (depending on the reactor). In some embodiments an ALD process is modified to use extremely long or continuous pulse times. For example, in some embodiments an ALD process is modified to use no purge or removal at all after at least one reactant pulse. In some embodiments no purge is used after a rhenium precursor pulse. In some embodiments no purge is used after a second reactant pulse and/or after a third reactant pulse. In some embodiments no purge is used after either a rhenium precursor pulse, a second reactant pulse or a third reactant pulse.

Briefly, the substrate on which a rhenium sulfide film or other TMDC film is to be deposited is loaded in a reaction chamber and is heated to a suitable deposition temperature, generally at lowered pressure. For ALD-type processes, deposition temperatures are maintained below the precursor thermal decomposition temperature but at a high enough level to avoid condensation of reactants and to provide the activation energy for the desired surface reactions. Of course, the appropriate temperature window for any given deposition process will depend upon a variety of factors including the surface on which the rhenium-containing film is deposited and the reactant species involved. In some embodiments the deposition temperature is from about 200° C. to about 500° C., as discussed in more detail below.

In some embodiments, such as some CVD-type processes, the deposition temperature may be above the decomposition temperature of one or more of the reactants. In some embodiments the deposition temperature is above the decomposition temperature of the rhenium precursor but still low enough to maintain reasonably surface-controlled growth of a film. For example, in some such embodiments the growth rate of the rhenium-containing film or other TMDC film is less than or equal to about a monolayer of material per deposition cycle. In some embodiments a deposition cycle growth rate may be less than or equal to about 50%, preferably less than about 25%, and more preferably less than about 10% of about a monolayer of material being deposited per cycle.

In some embodiments of an ALD-type process, the surface of the substrate is contacted with a vapor phase first transition metal precursor, for example a rhenium precursor, a tantalum precursor, a zirconium precursor, a hafnium precursor, a strontium precursor, a tungsten precursor or a molybdenum precursor. In some embodiments a pulse of vapor phase first transition metal precursor is provided to a reaction space containing the substrate. In some embodiments the substrate is moved to a reaction space containing vapor phase first transition metal precursor. Conditions may be selected such that no more than about one monolayer of species of the first transition metal precursor is adsorbed on the substrate surface in a self-limiting manner. The appropriate contacting times can be determined by the skilled artisan based on the particular circumstances. Excess first reactant and reaction byproducts, if any, are removed from the substrate surface, such as by purging with an inert gas or by removing the substrate from the presence of the first reactant.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

Purging means that vapor phase precursors and/or vapor phase byproducts are removed from the substrate surface such as by evacuating the reaction chamber with a vacuum pump and/or by replacing the gas inside a reaction chamber with an inert gas such as argon or nitrogen. Typical purging times are from about 0.05 to 20 seconds, and can be about 0.2 and 10, or between about 0.5 and 5 seconds. However, other purge times can be utilized if necessary, such as where highly conformal step coverage over extremely high aspect ratio structures or other structures with complex surface morphology is needed, or where different reactor types may be used, such as a batch reactor.

The surface of the substrate is subsequently contacted with a vapor phase second gaseous reactant. In some embodiments the gaseous second reactant comprises a reducing agent, such as $NH_3$. The second reactant reacts with the transition metal-containing species from the first reactant adsorbed on the substrate surface.

In some embodiments a pulse of a second gaseous reactant is provided to a reaction space containing the substrate. In some embodiments the substrate is moved to a reaction space containing the vapor phase second reactant.

Excess second reactant and gaseous byproducts of the surface reaction, if any, are removed from the substrate surface, for example by purging the reaction space or by moving the substrate from the reaction space containing the reactant. In some embodiments there is no dwell time for the reactants.

The surface of the substrate is subsequently contacted with a vapor phase third gaseous reactant comprising a chalcogenide precursor, for example a sulfur precursor, such as $H_2S$. In some embodiments the gaseous third reactant comprises a sulfur precursor. The third reactant reacts with the transition metal-containing species adsorbed on the substrate surface.

In some embodiments a pulse of a third gaseous reactant comprising a chalcogenide precursor is provided to a reaction space containing the substrate. In some embodiments the substrate is moved to a reaction space containing the vapor phase second reactant.

Excess third reactant and gaseous byproducts of the surface reaction, if any, are removed from the substrate surface, for example by purging the reaction space or by moving the substrate from the reaction space containing the reactant. In some embodiments there is no dwell time for the reactants.

The steps of contacting and removing form a deposition cycle that is repeated until a TMDC thin film of the desired composition and thickness has been formed on the substrate, such as a rhenium sulfide thin film, with each cycle typically leaving no more than about a molecular monolayer of rhenium sulfide material.

The steps of contacting and removing a first vapor phase transition metal precursor, such as a rhenium precursor, may be referred to as a first precursor phase, a transition metal precursor phase, or a transition metal phase. For example, in the case of rhenium sulfide deposition the first precursor phase may be referred to as a rhenium precursor phase or rhenium phase. The steps of contacting and removing a second vapor phase reactant may be referred to as a second reactant phase. The steps of contacting and removing a third vapor phase reactant may be referred to as a third precursor phase or third reactant phase. Together, these three phases can make up a deposition cycle.

As mentioned above, each phase of each ALD cycle can be self-limiting. An excess of reactant precursors is supplied in each phase to saturate the susceptible structure surfaces. Surface saturation ensures reactant occupation of most or all available reactive sites (subject, for example, to physical size or "steric hindrance" restraints) and thus ensures excellent step coverage and uniformity. Typically, less than one molecular layer of material is deposited with each cycle, however, in some embodiments more than one molecular layer is deposited during each cycle.

Suitable transition metal precursors may be selected by the skilled artisan. In some embodiments the transition metal precursor is a transition metal halide. In some embodiments the transition metal halide comprises chloride.

In some embodiments the second reactant comprises a reducing agent. In some embodiments the reducing agent comprises nitrogen. In some embodiments the reducing agent comprises hydrogen and nitrogen species. In some embodiments the reducing agent may comprise a nitrogen-containing reactant, such as $NH_3$. In some embodiments the reducing agent comprises nitrogen, and may comprise, for example, $NH_3$, $N_2$, $N_2H_4$, nitrogen plasma, excited species of nitrogen, nitrogen radicals, atomic nitrogen or hydrazine species. In some embodiments the second reactant may comprise hydrogen species, such as hydrogen plasma, excited species of hydrogen, hydrogen radicals or atomic hydrogen. In some embodiments the reducing agent is an organic reducing agent.

In some embodiments the reducing agent comprises one or more silanes.

In some embodiments the reducing agent comprises one or more boron compounds. For example, in some embodiments the reducing agent comprises one or more boranes.

A boron compound can be selected for use as the reducing agent that has a suitable reducing strength and avoid boride formation. In some embodiments the reducing agent comprises one or more of the following boron compounds:

Boranes having formula (I) $B_nH_{n+x}$, wherein n is an integer from 1 to 10, or from 2 to 6, and x is an even integer, such as 4, 6 or 8. Exemplary boranes of formula (I) that can be used include nido-boranes ($B_nH_{n+4}$), arachno-boranes ($B_nH_{n+6}$) and hypho-boranes ($B_nH_{n+8}$). Exemplary boranes of formula (II) include conjuncto-boranes ($B_nH_m$).

Boranes of formula (II) $B_nH_m$, wherein n is an integer from 1 to 10, or from 2 to 6, and m is an integer different than n, m being from 1 to 10 or from 2 to 6.

Borane complexes, such as $(CH_3CH_2)_3N.BH_3$.

Borane halides, such as fluorides, bromides and chlorides. In some embodiments $B_2H_5Br$ may be used as a reducing agent. In some embodiments boron halides with high boron/halide ratio, such as $B_2F_4$, $B_2Cl_4$ and $B_2Br_4$ may be used as a reducing agent.

Borane halide complexes.

Halogenoboranes according to formula (III) $B_nX_n$, wherein X is Cl or Br and n=4, 8-12 when X=Cl, and n=7-10 when X=Br.

Carboranes according to formula (IV) $C_2B_nH_{n+x}$, wherein n is an integer from 1 to 10, or from 2 to 6, and x is an even integer, for example 2, 4 or 6. Examples of carboranes according to formula (IV) that can be used include closo-carboranes ($C2B_nH_{n+2}$), nido-carboranes ($C2B_nH_{n+4}$), and arachno-carboranes ($C2B_nH_{n+6}$).

Amine-borane adducts according to formula (V) $R_3NBX_3$, wherein R is linear or branched C1-C10, for example C1-C4 alkyl, or H, and X is linear or branched C1-C10, for example C1-C4 alkyl, H or a halogen.

Aminoboranes where one or more of the substituents on B is an amino group according formula (VI) $R_2N$, wherein R is linear or branched C1-C10, for example C1-C4 alkyl or substituted or an unsubstituted aryl group. An example of an aminoborane that can be used as a reducing agent is $(CH_3)_2NB(CH_3)_2$.

Cyclic borazine ($—BH—NH—)_3$ and its volatile derivatives.

Alkyl borons or alkyl boranes, wherein the alkyl is linear or branched C1-C10 alkyl, for example C2-C4 alkyls.

In some embodiments triethyl boron $(CH_3CH_2)_3B$ is used as a reducing agent.

In some embodiments the second reactant comprises a reducing agent comprising a substituted hydrazine. The substituted hydrazine may comprise an alkyl group with at least four (4) carbon atoms, wherein "alkyl group" refers to a saturated or unsaturated hydrocarbon chain of at least four (4) carbon atoms in length, such as, but not limited to, butyl, pentyl, hexyl, heptyl and octyl and isomers thereof, such as n-, iso-, sec- and tert-isomers of those. The alkyl group may be straight chain or branched-chain and may embrace all structural isomer forms of the alkyl group. In some embodiments the alkyl chain might be substituted. In some embodiments the alkyl-hydrazine may comprise at least one hydrogen bonded to nitrogen. In some embodiments the alkyl-hydrazine may comprise at least two hydrogens bonded to nitrogen. In some embodiments the alkyl-hydrazine may comprise at least one hydrogen bonded to nitrogen and at least one alkyl chain bonded to nitrogen.

In some embodiments the second reactant may comprise an alkyl-hydrazine and may further comprise one or more of tertbutylhydrazine ($C_4H_9N_2H_3$), dimethylhydrazine or diethylhydrazine or dipropylhydrazine or di-isopropylhydrazine.

In some embodiments the substituted hydrazine has at least one hydrocarbon group attached to nitrogen. In some embodiments the substituted hydrazine has at least two hydrocarbon groups attached to nitrogen. In some embodiments the substituted hydrazine has at least three hydrocarbon groups attached to nitrogen. In some embodiments the substituted hydrazine has at least one C1-C3 hydrocarbon group attached to nitrogen. In some embodiments the substituted hydrazine has at least one C4-C10 hydrocarbon group attached to nitrogen. In some embodiments the substituted hydrazine has linear, branched or cyclic or aromatic hydrocarbon group attached to nitrogen. In some embodiments the substituted hydrazine comprises substituted hydrocarbon group attached to nitrogen.

In some embodiments the substituted hydrazine has the following formula (1):

$R^I R^{II}—N—NR^{III}R^{IV}$, wherein $R^I$ can be selected from hydrocarbon group, such as linear, branched, cyclic, aromatic or substituted hydrocarbon group and each of the $R^{II}$, $R^{III}$, $R^{IV}$ groups can be independently selected to be hydrogen or hydrocarbon groups, such as linear, branched, cyclic, aromatic or substituted hydrocarbon group.

In some embodiments in the formula (1) each of the $R^I$, $R^{II}$, $R^{III}$, $R^{IV}$ can be C1-C10 hydrocarbon, C1-C3 hydrocarbon, C4-C10 hydrocarbon or hydrogen, such as linear, branched, cyclic, aromatic or substituted hydrocarbon group. In some embodiments at least one of the $R^I$, $R^{II}$, $R^{III}$, $R^{IV}$ groups comprises aromatic group such as phenyl group. In some embodiments at least one of the $R^I$, $R^{II}$, $R^{III}$, $R^{IV}$ groups comprises methyl, ethyl, n-propyl, i-propyl, n-butyl, i-butyl, s-butyl, tertbutyl group or phenyl group. In some embodiments at least two of the each $R^I$, $R^{II}$, $R^{III}$, $R^{IV}$ groups can be independently selected to comprise methyl, ethyl, n-propyl, i-propyl, n-butyl, i-butyl, s-butyl, tertbutyl group or phenyl group. In some embodiments $R^{II}$, $R^{III}$ and $R^{IV}$ groups are hydrogen. In some embodiments at least two one of the $R^{II}$, $R^{III}$, $R^{IV}$ groups are hydrogen. In some embodiments at least one of the $R^{II}$, $R^{III}$, $R^{IV}$ groups are hydrogen. In some embodiments all of the $R^{II}$, $R^{III}$, $R^{IV}$ groups are hydrocarbons.

In some embodiments the second reactant does not significantly contribute material to the deposited material or the final formed TMDC film.

In some embodiments the third reactant may comprise a chalcogenide precursor that contributes a chalcogenide to the TMDC film. In some embodiments the chalcogenide precursor may comprise $H_2S$, $H_2S_2$, $H_2Se$, $H_2Se_2$, $H_2Te$, $H_2Te_2$, $(NH_4)_2S$, $(CH_3)_2Se$, $(CH_3)_2Te$, or elemental or atomic Se, Te or S. In some embodiments the chalcogenide precursor may comprise one or more hydrogen-chalcogen bonds, such as $H_2S_2$, $H_2Se_2$, or $H_2Te_2$. In some embodiments the chalcogenide precursor may have the formula R—Y—H, wherein Y is S, Se, or Te and R can be a substituted or unsubstituted hydrocarbon, for example a C1-C8 alkyl or substituted alkyl, such as an alkylsilyl group, or a linear or branched C1-C5 alkyl group. In some embodiments, a sulfur precursor comprises $H_2S_n$, wherein n is from 4 to 10. In some embodiments the third reactant may be a sulfur precursor. The sulfur precursor may comprise one or more H—S bonds. In some embodiments a sulfur precursor may comprise, for example, $H_2S$, an alkylsulfur compound such as $(CH_3)_2S$, $(NH_4)_2S$, dimethyl sulfoxide $((CH_3)_2SO)$, elemental or atomic S, or $H_2S_2$. In some embodiments the third reactant comprises $H_2S$. In some embodiments the third reactant consists of $H_2S$.

The precursors employed in the deposition processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically contacting times are from about 0.05 to 20 seconds, more preferably between about 0.2 and 10, and still more preferably between about 0.5 and 5 seconds. In some embodiments the contacting time is about 1 second.

However, depending on the substrate type and its surface area, the contacting time may be even higher than 20 seconds. Contacting times can be on the order of minutes or longer in some cases. The contacting time can be determined by the skilled artisan based on the particular circumstances.

The mass flow rate of the reactants can also be determined by the skilled artisan. In some embodiments the flow rate of a transition metal precursor, such as a rhenium, tantalum, zirconium, hafnium, strontium, tungsten or molybdenum precursor, is preferably between about 1 and 1000 sccm without limitation, or between about 100 and 500 sccm.

The pressure in a reaction chamber during the deposition of the rhenium-containing thin film is typically from about 0.01 to about 50 mbar, or from about 0.1 to about 10 mbar. However, in some cases the pressure will be higher or lower than this range, as can be determined by the skilled artisan given the particular circumstances. In some embodiments atmospheric pressure may be used.

Before starting the deposition of the film, the substrate is typically heated to a suitable deposition temperature. The deposition temperature varies depending on the type of thin film formed, physical properties of the precursors, etc. In some embodiments the deposition temperature is about 20° C. to about 500° C. In some embodiments the deposition temperature is about 400° C.

As mentioned above, in some embodiments each reaction is self-limiting and monolayer by monolayer growth is achieved. These may be referred to as "true ALD" reactions. In some such embodiments the transition metal precursor may adsorb on the substrate surface in a self-limiting manner. A second reactant and third reactant will react in turn with the adsorbed transition metal precursor to form up to a monolayer of transition metal dichalcogenide, such as rhenium sulfide on the substrate.

However, in some embodiments ALD-type reactions are provided, in which there may be some precursor decomposition, but the growth saturates. That is, in some embodiments although a certain amount of film growth may be caused by thermal decomposition of the rhenium precursor at some deposition temperatures, saturated growth is preferably achieved when the second reactant is utilized. Such a reaction is an example of an ALD-type reaction. In such ALD-type reactions, films with good uniformity and relatively few impurities can be deposited.

In some embodiments thermal decomposition of one or more reactants occurs, such as the rhenium precursor. In such cases, the growth rate may not fully plateau with increasing reactant pulse times. Rather, the growth rate may continue to rise with increased pulse times, although the growth rate may increase more slowly with ever increasing pulse times. Thus in some embodiments a pulsed-CVD type deposition process is used, in which reactants are provided alternately and separately, but some gas-phase reactions may occur. Preferably the conditions are selected such that surface controlled decomposition is the mechanism for decomposition, which leads to good uniformity and good step coverage. Reaction conditions can also be selected such that good control of the reactions is maintained, leading to good quality films with low impurities.

Thus, in some embodiments the deposition temperature is below the thermal decomposition temperature of the rhenium precursor (or other reactant as described herein) while in other embodiments the deposition temperature may be at or above the thermal decomposition temperature.

As mentioned above, in some embodiments a thin TMDC film, such as a thin rhenium-containing film, is deposited on a substrate surface by a pulsed-CVD process in which a vapor phase transition metal precursor is intermittently pulsed into a reaction space comprising the substrate and purged from the reaction space. The substrate may be contacted with a second vapor phase precursor and a third vapor-phase chalcogenide precursor, for example in a sequential pulse. The pulses of the transition metal precursor, second and/or third precursors may at least partially overlap.

In some embodiments one or more chemical vapor etch cycles, as described below, is included in a TMDC deposition process, such as a rhenium sulfide deposition process. In some embodiments one or more etch cycles is included at regular intervals in the deposition process. In some embodiments one or more etch cycles is provided at a given ratio to the number of deposition cycles. For example, an etch cycle may be carried out every 1, 2, 3, 4, 5, 10, 20, 50 or more deposition cycles. In some embodiments two or more deposition cycles are carried out for each etch cycle. In some embodiments the ratio of deposition cycles to etch cycles is at least 10.

In some embodiments one or more etch cycles are carried out at a temperature of about 200° C. to about 500° C. In some embodiments one or more etch cycles is carried out at the same temperature as the deposition cycles. In some embodiments the etch cycles are carried out in the same reaction space as the deposition cycles.

In some embodiments the deposited TMDC thin film may be subjected to optional post deposition treatment process. In some embodiments, for example, a post deposition treatment process may comprise an annealing process, for example a forming gas annealing process. In some embodiments a post deposition treatment process may comprise exposing the rhenium sulfide thin film to a plasma. In some other embodiments a post deposition treatment process does not comprise exposing the rhenium sulfide thin film to a plasma.

In some embodiments a post deposition treatment process comprises conducting one or more chemical vapor etch cycles, as described below. In some embodiments the one or more chemical vapor etch cycles are carried out immediately following the deposition. In some embodiments the one or more chemical vapor etch cycles are carried out at the same temperature as the deposition. In some embodiments the one or more chemical vapor etch cycles are carried out in the same reaction space as the deposition cycles.

The processing time depends on the thickness of the layer to be produced and the growth rate of the film. In ALD type processes, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be on order of minutes or more in some cases.

In some embodiments the deposition process is repeated to deposit a TMDC film such as a rhenium sulfide film having a thickness of less than about 10 molecular layers. In some embodiments the deposition process is repeated to deposit a TMDC film such as a rhenium sulfide film having a thickness of less than about 5 molecular layers. In some embodiments the deposition process is repeated to deposit a TMDC film such as a rhenium sulfide film having a thickness of less than about 3 molecular layers.

In some embodiments the deposition process is repeated about 10000 cycles or less, about 5000 cycles or less, about 1000 cycles or less, about 500 cycles or less, about 250 cycles or less, about 100 cycles or less, about 50 cycles or less, or about 25 cycles or less, with the cycle being repeated at least one time, or at least two or more times.

In some embodiments a TMDC film such as a rhenium sulfide film is deposited to have a thickness of 100 nm or less, 50 nm or less, 20 nm or less, less than about 10 nm, or less than about 5 nm. The thickness may be at least the thickness of material deposited in one deposition cycle. In some embodiments the thickness is at least one monolayer.

Examples of suitable reactors that may be used for the deposition of rhenium sulfide thin films include commercially available ALD equipment. In addition to these ALD reactors, many other kinds of reactors capable of deposition of thin films, including CVD reactors equipped with appropriate equipment and means for pulsing the precursors, can be employed for carrying out various embodiments disclosed herein. Preferably, reactants are kept separate until reaching the reaction chamber, such that shared lines for the precursors are minimized.

The growth processes can optionally be carried out in a reactor or reaction space connected to a cluster tool. In a cluster tool, because each reaction space is dedicated to one type of process, the temperature of the reaction space in each module can be kept constant, which clearly improves the throughput compared to a reactor in which is the substrate is heated up to the process temperature before each run.

Deposition of Rhenium Sulfide Thin Films

As discussed above, thin films comprising rhenium sulfide may be deposited by vapor deposition processes in which the substrate is contacted with a first reactant comprising a rhenium precursor, a second reactant comprising a reducing agent, such as a nitrogen-containing reactant such as $NH_3$ or a silane or borane compound, and a third reactant comprising a sulfur precursor, such as $H_2S$. As discussed above, the rhenium sulfide may be a two-dimensional material.

In some embodiments the vapor deposition process may be a cyclical deposition process in which the substrate is repeatedly contacted with three vapor phase reactants, for example, an atomic layer deposition (ALD) process or CVD process, such as a sequential chemical vapor deposition (CVD) process or a pulsed CVD process.

More generally, according to some embodiments, and illustrated in FIG. 1, a rhenium sulfide thin film is formed on a substrate by an ALD-type process comprising at least one deposition cycle 100 the deposition cycle comprising:

contacting the surface of a substrate with a vaporized rhenium precursor at step 110 to form at most a molecular monolayer of rhenium-containing species on the substrate;

removing excess rhenium precursor and reaction by products, if any, from the surface at step 120;

contacting the surface of the substrate with a vaporized second reactant comprising a reducing agent, such as a reducing agent comprising nitrogen, for example $NH_3$, or a reducing agent comprising a silane or borane compound, at step 130, such that the second reactant reacts with the rhenium-containing species on the substrate surface to form a rhenium-containing material;

removing from the surface excess second reactant and any gaseous by-products formed in the reaction between the rhenium species and the second reactant at step 140;

contacting the surface of the substrate with a vapor phase third reactant comprising a sulfur precursor, such as $H_2S$ at step 150; and removing from the surface excess third reactant and any gaseous by-products formed in the reaction between the rhenium species on the substrate surface and the third reactant at step 160.

The contacting and removing steps can be repeated 170 until a rhenium sulfide thin film of the desired thickness has been formed. In some embodiments the first reactant comprises a rhenium halide, such as $ReCl_5$, the second reactant comprises $NH_3$ and the third reactant comprises $H_2S$. In some embodiments a substrate is alternately and sequentially contacted with $ReCl_5$, $NH_3$ and $H_2S$. In some embodiments the first, second and third reactants are the only reactants used in a deposition cycle.

Although the illustrated deposition cycle begins with contacting the surface of the substrate with the rhenium precursor, in other embodiments the deposition cycle may begin with contacting the surface of the substrate with the second reactant or the third reactant. It will be understood by the skilled artisan that if the surface of the substrate is contacted with a first reactant and that reactant does not react then the process will effectively begin when the next reactant that reacts with the surface is provided.

In some embodiments one or more of the reactants is provided with the aid of an inert carrier gas. In some embodiments, the reactants and reaction by-products can be removed from the substrate surface by stopping the flow of the reactant while continuing the flow of an inert carrier gas such as nitrogen or argon. However, in some embodiments the substrate is moved such that different reactants alternately and sequentially contact the surface of the substrate in a desired sequence for a desired time. In some embodiments the removing steps are not performed. In some embodiments no reactant is removed from the various parts of a reaction chamber. In some embodiments the substrate is moved from a part of a reactor or reaction chamber containing a first reactant or precursor to another part of the reactor or reaction chamber containing the second reactant and then to another part of the reactor or reaction chamber containing the third reactant. In some embodiments the substrate is moved from a first reaction chamber containing a first reactant to a second, different reaction chamber containing a second reactant and to a third, different reaction chamber containing a third reactant.

In some embodiments when contacting the substrate with the vapor-phase rhenium precursor the substrate is not also contacted with any other metal, semi-metal or metalloid precursor. That is, in some embodiments while the substrate is contacted with the vapor-phase rhenium precursor it is not also contacted with a different reactant that comprises a metal, semi-metal or metalloid.

In some embodiments the substrate is not contacted with another metal, semi-metal or metalloid precursor, other than the rhenium precursor. For example, in some embodiments the substrate is not contacted with another metal, semi-metal or metalloid precursor in at least one deposition cycle. In some embodiments the substrate is not contacted with another metal, semi-metal or metalloid precursor in all deposition cycles.

In some embodiments the vapor-phase rhenium precursor comprises a single rhenium compound. In some embodiments the rhenium precursor comprises a rhenium compound and does not comprise a compound comprising another metal, semi-metal or metalloid element.

In some embodiments the vapor-phase rhenium precursor is not a mixture. For example, in some embodiments the vapor-phase rhenium compound is not a mixture comprising other metal, semi-metal or metalloid elements.

In some embodiments the vapor-phase rhenium precursor does not comprise a solvent.

In some embodiments the rhenium sulfide film may contain one or more impurities, such as C, H, O or Cl. In some embodiments the film may contain less than about 3 at-% carbon, preferably less than about 2 at-% carbon, and most preferably less than about 1 at-% carbon. In some embodiments the film may contain 0.5 at-% carbon or less, 0.3 at-% carbon or less or even 0.1 at-% carbon or less. In some embodiments the film may contain less than about 12 at-% hydrogen, less than about 3 at-% hydrogen, preferably less than about 2 at-% hydrogen, and most preferably less than about 1 at-% hydrogen. In some embodiments the film may contain about 0.6 at-% hydrogen or less, about 0.4 at-% hydrogen or less, about 0.3 at-% hydrogen or less, or about 0.2 at-% hydrogen or less. In some embodiments the film may contain less than about 60 at-% oxygen, less than about 20 at-% oxygen, less than about 10 at-% oxygen, or less than about 5 at-% oxygen. In some embodiments the film may contain 2 at-% or less oxygen, 1 at-% or less oxygen, 0.6 at-% or less oxygen, or 0.2 at-% or less oxygen. In some embodiments the film may contain less than about 20 at-% Cl, less than about 10 at-% Cl, less than about 5 at-% Cl, less than about 2 at-% Cl, or less than about 1 at-% Cl. In some embodiments the film may contain about 0.6 at-% Cl or less, or about 0.3 at-% Cl or less. It is to be noted that a rhenium sulfide film containing the above described impurities may still be suitable for different applications, such as for a 2D-material.

Suitable rhenium precursors may be selected by the skilled artisan. In some embodiments the rhenium precursor is a rhenium halide. In some embodiments the rhenium halide comprises chloride. In some embodiments the rhenium precursor comprises at least one Re—X bond, at least two Re—X bonds, at least three Re—X bonds, at least four Re—X bonds, at least five Re—X bonds or at least six Re—X bonds, wherein each X is independently a halogen, such as chlorine, fluorine, bromine or iodine. In some embodiments where the rhenium precursor comprises two or more Re—X bonds each X is the same halogen. In some embodiments where the rhenium precursor comprises two or more Re—X bonds, two or more X's may be different halogens. In some embodiments the rhenium precursor is $ReCl_5$. In some embodiments the rhenium precursor comprises chlorine or a chloride ligand. In some embodiments the rhenium precursor is a rhenium fluoride, such as $ReF_6$. In some embodiments the rhenium precursor is a rhenium bromide. In some embodiments the rhenium precursor is a rhenium iodide.

In some embodiments the rhenium precursor does not comprise organic ligands. In some embodiments the rhenium precursor does not comprise hydrogen. In some embodiments the rhenium precursor does not comprise carbon. In some embodiments the rhenium precursor does not comprise oxygen. In some embodiments the rhenium precursor does not comprise nitrogen. In some embodiments the rhenium precursor does not comprise sulfur. In some embodiments the rhenium precursor does not comprise a metal other than rhenium. In some embodiments the rhenium precursor does not comprise another semi-metal or metalloid.

As mentioned above, the rhenium precursor employed in the deposition processes may be solid, liquid or gaseous material, provided that the rhenium precursor is in vapor phase before it is conducted into the reaction chamber and contacted with the substrate surface.

In some embodiments the second reactant comprises a reducing agent, for example as described above. In some embodiments the reducing agent comprises nitrogen. In some embodiments the reducing agent comprises hydrogen and nitrogen. In some embodiments the reducing agent may comprise a nitrogen-containing reactant, such as $NH_3$. In some embodiments the reducing agent comprises nitrogen, and may comprise, for example, $NH_3$, $N_2$, $N_2H_4$, nitrogen plasma, excited species of nitrogen, nitrogen radicals, atomic nitrogen or hydrazine species (as described above). In some embodiments the second reactant may comprise hydrogen species, such as hydrogen plasma, excited species of hydrogen, hydrogen radicals or atomic hydrogen. In some embodiments the second reactant may comprise a silane. In some embodiments the second reactant may comprise a boron compound, as described above. For example the second reactant may comprise a borane compound as described above. In some embodiments the second reactant may comprise an organic reducing agent. In some embodiments the second reactant does not significantly contribute material to the deposited material or the final formed film.

In some embodiments the third reactant may be a sulfur precursor that contributes sulfur to the rhenium sulfide film. In some embodiments the sulfur precursor may comprise one or more H—S bonds. In some embodiments a sulfur precursor may comprise, for example, $H_2S$, an alkylsulfur compound such as $(CH_3)_2S$, $(NH_4)_2S$, dimethylsulfoxide $((CH_3)_2SO)$, elemental or atomic S, or $H_2S_2$ or other reactants with the formula R—S—H, wherein R can be a substituted or unsubstituted hydrocarbon, preferably a C1-C8 alkyl or substituted alkyl, such as an alkylsilyl group, more preferably a linear or branched C1-C5 alkyl group. In some embodiments, a sulfur precursor comprises $H_2S_n$, wherein n is from 4 to 10. In some embodiments the third reactant comprises $H_2S$. In some embodiments the third reactant consists of $H_2S$.

In some embodiments the reactant comprising a rhenium precursor, the second reactant comprising a reducing agent and the third reactant comprising a sulfur precursor are the only reactants used in the deposition cycle.

In some embodiments the rhenium containing reactant comprises $ReCl_5$, the second reactant comprising a reducing agent comprises $NH_3$ and the sulfur-containing reactant comprises $H_2S$. In some embodiments the rhenium containing reactant is $ReCl_5$, the second reactant is $NH_3$ and the sulfur-containing reactant is $H_2S$.

In some embodiments the process may be a thermal process that does not utilize any plasma reactants. In some embodiments the process may utilize a plasma. For example, nitrogen, hydrogen, sulfur or oxygen containing plasma, radicals, excited species or atoms may be used in a plasma process. Plasmas may comprise a noble gas such as Ar or He, or combinations of two or more noble gases. Plasmas may also comprise mixtures thereof, such as nitrogen and hydrogen containing plasma as well as noble gas The deposition process is continued by repeating the deposition cycle until a rhenium sulfide film of a desired thickness is deposited. The actual thickness may be selected depending on the particular circumstances. In some embodiments, a rhenium sulfide film is deposited to a thickness of less than about 10 nm or less than about 5 nm. In some embodiments the rhenium sulfide film may have a thickness of 10 nm or less, 5 nm or less, 3 nm or less, 2 nm or less, 1.5 nm or less, or 1.0 nm or less, down to a single molecular layer or even a partial molecular layer.

In some embodiments the deposition processes allows for deposition of very thin rhenium sulfide layers. In some embodiments $ReS_2$ is deposited to a thickness of less than bout 20 molecular layers, less than about 10 molecular layers, less than about 5 molecular layers or less than about 3 molecular layers, down to a partial molecular layer.

In some embodiments a method for depositing a rhenium sulfide film on a substrate may comprise from 1 to 1000 depositions cycles, from 1 to 500 deposition cycles, from 1 to 200 deposition cycles, from 1 to 100 deposition cycles, from 1 to 50 cycles, from 1 to 25 cycles, from 1 to 15 cycles, or from 1 to 10 cycles. In some embodiments the ALD cycle comprises alternately and sequentially contacting the substrate with a rhenium precursor and a sulfur reactant as described above.

The rhenium sulfide thin films may be deposited on a three-dimensional structure. In some embodiments the step coverage of the rhenium thin film may be equal to or greater than about 50, about 80, about 90, about 95, about 98 or about 99%.

As mentioned above, the substrate can comprise various types of materials. In some embodiments the substrate may comprises a number of thin films with varying chemical and physical properties. Further, the substrate surface may have been patterned and may comprise structures such as nodes, vias and trenches.

In some embodiments a film comprising rhenium sulfide is deposited at a deposition temperature of about 200° C. to about 500° C. In some embodiments a smooth $ReS_2$ film is deposited at about 400° C.

In some embodiments a rhenium sulfide thin film is deposited at a growth rate of about 0.2 to about 1.5 Å cycle-1 or about 0.4 to about 1.1 Å/cycle. In some embodiments the rhenium sulfide thin film is deposited at a growth rate of about 0.01 Å/cycle to about 5 Å/cycle, from about 0.1 Å/cycle to about 2 Å/cycle, or from about 0.2 Å/cycle to about 1.2 Å/cycle. In some embodiments a rhenium sulfide thin film is deposited at a growth rate of more than about 0.2 Å/cycle, 0.4 Å/cycle, 0.5 Å/cycle, 0.6 Å/cycle, or 0.7 Å/cycle.

In some embodiments the elemental S:Re ratio is from about 0.5 to about 1.2, or from about 0.6 to about 1.0.

In some embodiments the resistivity of the rhenium sulfide film is from about 0.01 to about 1.5 Ωcm, about 0.1 to about 1.2 Ωcm or about 0.2 to about 0.4 Ωcm.

In some embodiments the rhenium sulfide thin film can find use in integrated circuits, semiconductor devices or optical devices. In some embodiments the rhenium sulfide film is used as a channel material in an integrated circuit device, for example as a high mobility channel material in a logic device. In some embodiments the rhenium sulfide thin films may find use, for example, as channel materials in a logic device, as a work function metal in a gate stack, as metal capping layers, for example copper, cobalt or tungsten capping layers or as contact metal layers or as fill layers for 3D-structures, such as vias, trenches or other structures. In some embodiments the rhenium sulfide thin films may be used as a 2D material, as discussed in more detail below. In some embodiments a 2D material is used in applications where ultrathin, continuous and possibly pin-hole free tin films are utilized, such as in applications where electrically conductive or semiconducting thin films are desired. In some embodiments rhenium sulfide thin films are used in applications such as targeting photonics, photocatalysis, water-splitting, or in lithium-ion or lithium sulfur batteries. In some embodiments rhenium sulfide thin films are used as a lubricating layer, for example in MEMS structures.

2D Materials

The vapor deposition processes described herein may be used to deposit 2D materials comprising rhenium sulfide, for example $ReS_2$ 2D materials. 2D materials, also referred to as single layer materials, are materials that consist of a single connected molecular monolayer. While 2D materials form a single connected molecular monolayer, multiple monolayers may be deposited by the deposition processes disclosed herein. For example, in the case of 2D $ReS_2$, the 2D material comprises a single layer of covalently bonded $ReS_2$ molecules, arranged so that one layer of Re atoms is sandwiched between two layers of S atoms. However, $ReS_2$ can act as a 2D layer with thicker layers as well. Thus, as mentioned above, multiple monolayers may be deposited to form the 2D material.

Due to their unusual characteristics, 2D rhenium sulfide materials are useful in a wide variety of applications, for example as lubrication, in optoelectronics, spintronics and valleytronics, in THz generation and detection, for use as catalysts, chemical and biological sensors, supercapacitors, LEDs, solar cells, Li-ion batteries, and as MOSFET channel materials.

2D rhenium sulfide thin films deposited by the methods disclosed herein possess electronic properties that make them useful for semiconductor device miniaturization. For example, 2D rhenium sulfide films have a direct band gap and can be used as a channel material in a gate stack or transistors.

According to some embodiments a 2D material comprising rhenium sulfide can be deposited by vapor deposition according to the methods disclosed herein. In some embodiments a 2D material comprising rhenium sulfide may comprise less than or equal to ten molecular monolayers of a compound comprising rhenium, less than or equal to five molecular monolayers, or less than or equal to three molecular monolayers.

In some embodiments a method for depositing a 2D material comprising rhenium sulfide on a substrate may comprise a deposition process as disclosed herein comprising at least one but less than or equal to 1000 depositions cycles, less than or equal to 500 deposition cycles, less than or equal to 200 deposition cycles, or less than or equal to 100 deposition cycles.

As can be selected by the skilled artisan depending on the particular precursors, substrate and process conditions, a method for depositing a 2D material comprising rhenium sulfide on a substrate may comprise an ALD process as disclosed herein comprising at least one but less than or equal to 1000 depositions cycles, less than or equal to 500 deposition cycles, less than or equal to 200 deposition cycles, or less than or equal to 100 deposition cycles, less than or equal to 50 cycles, less than or equal to 25 cycles, less than or equal to 15 cycles, or less than or equal to 10 cycles. In some embodiments the ALD cycle comprises alternately and sequentially contacting the substrate with a rhenium precursor, a second reactant comprising NH3 and a third reactant comprising a sulfur precursor, as described herein.

In some embodiments the deposited 2D material comprising rhenium sulfide may be 100 nm or less, 50 nm or less, 25 nm or less, 10 nm or less, 5 nm or less, 3 nm or less, 2 nm or less, 1.5 nm or less, or 1.0 nm or less, down to a single molecular layer or even a partial molecular layer.

Chemical Vapor Etching

Chemical vapor etching can be used to controllably remove TMDC material using sequential reaction steps. In some embodiments one or more etching cycles to remove TMDC material, for example from a deposited TMDC film, such as a rhenium sulfide thin film.

In some embodiments chemical vapor etching is used reduce the thickness of a TMDC film, such as a ReS$_2$ thin film. The chemical vapor etching process may comprise one or more etching cycles in which a substrate comprising a TMDC film, such as a ReS$_2$ film, is contacted with one or more pulses of an oxidant, such as oxygen. After contacting the substrate with the oxidant, excess oxidant is removed from the surface of the substrate. For example, excess oxidant may be purged from the reaction space with the aid of an inert gas.

In some embodiments an etch cycle comprises contacting the substrate with the etching reactant, such as an oxidant, and removing excess etching reactant from the substrate surface. In some embodiments an etch cycle comprises a first step of providing a pulse of the oxidant to a reaction space to contact the substrate surface comprising a TMDC film, such as a ReS$_2$ film, followed by a second step in which the excess oxidant and vapor phase reaction byproducts are removed from the reaction space, such as by purging with an inert gas like N$_2$.

In some embodiments an etch cycle comprises a first step of contacting the substrate with an etching reactant comprising O$_2$ or anther oxidant and a second step of removing oxygen from the vicinity of the substrate with an inert gas, such as N$_2$ or Ar gas. In some embodiments an etch cycle comprises alternately contacting the substrate with an etching reactant gas comprising O$_2$ and a purge gas comprising N$_2$. In some embodiments an etch cycle comprises alternately and sequentially providing an etching reactant comprising O$_2$ and a purge gas comprising N$_2$ to a reaction space comprising a substrate comprising a ReS$_2$ film.

In some embodiments the etching reactant comprises an oxidant. In some embodiments the etching reactant comprises oxygen. In some embodiments the etching reactant comprises oxygen and nitrogen. In some embodiments the etching reactant comprises O$_2$. In some embodiments the etching reactant comprises one or more of O$_3$, H$_2$O$_2$, O-based plasmas, atomic oxygen, oxygen radicals or other excited species of oxygen. In some embodiments the etching reactant comprises nitrogen and oxygen species such as oxides of nitrogen, for example NO$_2$ and N$_2$O, and plasmas, excited species or radicals from those. In some embodiments the etching reactant consists of O$_2$. In some embodiments the etching reactant is the only reactant used in an etching cycle.

In some embodiments the removal of the etching reactant is carried out with the aid of inert purge gas such as Ar, He, Xe, Kr or N$_2$ gas. In some embodiments the purge gas comprises N$_2$.

In some embodiments the etching reactant is provided to the reaction space in a pulse of from about 1 to 50 s, about 1 to 25 s, about 1 to 5 s or about 1 to 2 s. In some embodiments the purge gas is provided to the reaction space in a pulse of from about 1 to 50 s, about 1 to 25 s, about 1 to 5 s or about 1 to 2 s. In some embodiments the duration of the pulse of the etching reactant and the duration of the pulse of the purge gas are the same.

The etching cycle may be repeated a plurality of times. For example, the etch cycle may be repeated 2, 3, 4, 5, 10, 25, 50, 100, 200, 300, 400, 500 or more times in succession. Thus, in an etching process comprising multiple etch cycles, each step of contacting the substrate with the etching reactant may be separated by steps in which excess reactant and reaction byproducts are removed from the reaction space.

In some embodiments the etching cycles are carried out at a temperature of 200 to 500° C. In some embodiments the etching cycles are carried out at a temperature of 400° C.

In some embodiments the etch rate is about 15-20 nm/1000 etching cycles.

In some embodiments, no other reactive gas is used in the etching cycle. That is, in some embodiments the oxidant is the only active species used to achieve the etching of a TMDC film, such as a rhenium sulfide film.

In some embodiments one, two or more etch cycles are carried out to reduce the thickness of a rhenium sulfide film deposited by a vapor-deposition process. As discussed above, in some embodiments the etch cycles may be conducted at one or more intervals in a TMDC deposition process or following a TMDC deposition process as described herein. For example the etch cycles may be used to regulate the growth of the TMDC film and/or to change one or more properties of the film being deposited by a deposition process as described herein.

In some embodiments one, two or more etch cycles are carried out to reduce the thickness of a $ReS_2$ film deposited by a process as described herein. For example, one, two or more etching cycles may be used to reduce the thickness of a rhenium sulfide film deposited by a cyclic deposition process utilizing a rhenium halide precursor, a second reactant comprising a reducing agent, such as $NH_3$, and a third reactant comprising a sulfur precursor, such as $H_2S$. In some embodiments the etch cycles are carried out at one or more intervals in the deposition process. In some embodiments the etch cycles are carried out following deposition.

In some embodiments the etching cycle comprises contacting the substrate comprising the $ReS_2$ film with an etch reactant as described herein, such as an etch reactant comprising $O_2$, and subsequently removing excess etch reactant and reaction byproducts, if any, by purging the reaction space with an inert gas, such as Ar, He or $N_2$ gas. In some embodiments the etching cycles are carried out at the same temperature as the deposition process.

In some embodiments an etching process for reducing the thickness of a TMDC film, such as a rhenium sulfide film, is carried out immediately after deposition of the film. In some embodiments one or more treatments or additional processing steps are carried out on the rhenium sulfide film after deposition and prior to beginning the etching process.

It will be understood by those of skill in the art that numerous and various modifications can be made without departing from the spirit of the disclosed embodiments. The described features, structures, characteristics and precursors can be combined in any suitable manner.

What is claimed is:

1. A method for depositing a thin film comprising a transition metal dichalcogenide on a substrate in a reaction space, the method comprising:
    a deposition cycle comprising contacting the substrate with a vapor-phase first reactant comprising a transition metal precursor, a vapor-phase second reactant comprising a reducing agent, and a vapor phase third reactant comprising a chalcogenide precursor; and
    a chemical vapor etching cycles at one or more intervals in the deposition process, the chemical vapor etching cycle comprising contacting the substrate with a first etching reactant comprising an oxidant and purging excess first etching reactant from the reaction space with an inert gas,
    wherein the deposition cycle and chemical vapor etching cycle are carried out at a predetermined ratio to deposit the thin film comprising a transition metal dichalcogenide.

2. The method of claim 1, wherein the two or more deposition cycles are carried out for each chemical vapor etching cycle.

3. The method of claim 1, wherein the transition metal precursor is a transition metal halide.

4. The method of claim 1, wherein the thin film comprises $ReS_2$.

5. The method of claim 4, wherein the first reactant comprises $ReCl_5$.

6. The method of claim 1, wherein the second reactant comprises one or more of $NH_3$, $N_2$, $N_2H_4$, nitrogen plasma, excited species of nitrogen, nitrogen radicals, atomic nitrogen or silane, borane or hydrazine species.

7. The method of claim 1, wherein the third reactant comprises one or more H—S bonds.

* * * * *